United States Patent [19]

Tiefert et al.

[11] 4,224,734
[45] Sep. 30, 1980

[54] LOW ELECTRICAL AND THERMAL IMPEDANCE SEMICONDUCTOR COMPONENT AND METHOD OF MANUFACTURE

[75] Inventors: Karl H. Tiefert, Los Altos Hills; Rockford C. Curby, Santa Clara, both of Calif.

[73] Assignee: Hewlett-Packard Company, Palo Alto, Calif.

[21] Appl. No.: 2,926

[22] Filed: Jan. 12, 1979

Related U.S. Application Data

[63] Continuation of Ser. No. 868,003, Jan. 9, 1978, abandoned, which is a continuation of Ser. No. 630,825, Nov. 11, 1975, abandoned.

[51] Int. Cl.³ .............................................. B01J 17/00
[52] U.S. Cl. ........................................ 29/583; 29/580; 29/591
[58] Field of Search .......................... 29/580, 583, 591

[56] References Cited

U.S. PATENT DOCUMENTS

| | | | |
|---|---|---|---|
| 2,865,082 | 12/1958 | Gates | 29/583 |
| 3,427,708 | 2/1969 | Schutze | 29/580 |
| 3,716,429 | 2/1975 | Napoli | 29/580 |
| 3,820,236 | 6/1974 | Haitz | 29/583 |
| 3,864,819 | 2/1975 | Ying | 29/583 |

*Primary Examiner*—W. C. Tupman
*Attorney, Agent, or Firm*—Allston L. Jones

[57] ABSTRACT

A semiconductor component and a method for manufacturing the semiconductor component with low electrical and thermal impedances is provided. The semiconductor component includes a thin semiconductor device with a plurality of layers of various conductivity types forming the active regions and semiconductor/metallic transition layers. The low electrical impedance of the component is achieved by the use of the thin semiconductor device, while the low thermal impedance is provided by a thick pedestal metalization on the semiconductor device.

The method for manufacturing such a device includes the fabrication of at least one semiconductor device on one surface of a semiconductor substrate. The second surface of the semiconductor substrate is selectively etched by a controlled process to form a cavity of limited lateral extent adjacent to each of the semiconductor devices on the one surface. The surfaces of the device and the second surface of the substrate are selectively metalized such that the second surface metalization fills each of the cavities. Thus, after the individual semiconductor components are separated from each other, the thick metalization in the cavities forms a thick pedestal heat sink of the semiconductor component.

6 Claims, 6 Drawing Figures

LOW ELECTRICAL AND THERMAL IMPEDANCE SEMICONDUCTOR COMPONENT AND METHOD OF MANUFACTURE

This is a continuation of application Ser. No. 868,003, filed Jan. 9, 1978, now abandoned, which was a continuation of application Ser. No. 630,825 filed Nov. 11, 1975, now abandoned.

BACKGROUND OF THE INVENTION

This invention is concerned generally with semiconductor components and the method of manufacturing those components and, more particularly, with low electrical and thermal impedance semiconductor components and their method of manufacture. There are many applications where a low electrical impedance component is necessary. A few examples of these components are PIN diodes, impatt diodes, step recovery diodes and MOS capacitors.

To obtain a semiconductor device with a low electrical impedance, it is necessary to minimize the thickness of the substrate of the device. A typical low electrical impedance semiconductor device is produced by first fabricating a plurality of the devices on one surface of a selected semiconductor substrate. Next, one of several well-known techniques is used on the other surface to thin the entire substrate to the desired thickness.

Following the thinning of the substrate, a new other surface of the substrate is formed. This new other surface is then metalized to provide means of making electrical contact to that surface and to provide a heat sink for each of the plurality of semiconductor devices. And, finally, a scribe and break step is used to separate the individual semiconductor devices.

There are three widely used thinning techniques which include lapping and polishing, chemical etching, and electrochemical anisotropic etching. All three techniques are used to reduce the thickness of the substrate by working on the other surface of the substrate. The technique of thinning the substrate by lapping and polishing is an old technique that requires additional care as the substrate becomes thinner. When the substrate approaches the desired thinness, the substrate becomes very fragile and can be easily fractured during the final phases of thinning, metalization and separation into individual components.

The second thinning technique, chemical etching, is also well known. This technique is dependent on three factors: temperature, time and the intensity of the chemical reaction between the etchant and the substrate material. This technique, like lapping and polishing, produces a fragile thinned substrate in addition to requiring close control over the three factors which determine the speed and extent of the etching of the substrate.

The third thinning technique, electrochemical anisotropic etching, is a more recent development than the other two techniques and is described in a paper by H. A. Waggener entitled "Electrochemically Controlled Thinning of Silicon", Bell System Technical Journal, March 1970, pp. 473-475. This technique, like the other two, is typically utilized to thin the substrate by working on its other side and produces a fragile, uniformly thin substrate. Unlike the chemical etching technique, this technique is self-controlling. The regions of the substrate to be retained, namely, those layers that form the plurality of semiconductor devices, are passivated electrochemically, while the regions to be removed are not passivated and are chemically removed. In this technique, etching continues until the passivated region is reached, whereupon the etching speed slows by a factor of approximately 150 to 1 and effectively halts.

Following the thinning of the substrate by any of the above techniques, the new other surface of the substrate may be diffused with a gettering element, e.g., phosphorus or HCl, to remove impurities from the operating junctions of the semiconductor devices and thus improve the minority carrier lifetime of each semiconductor component. One gettering technique is described in a paper by P. H. Robinson and F. P. Heiman entitled "Use of HCl Gettering in Silicon Device Processing", Journal of the Electrochemical Society: Solid State Science, Vol. 118, No. 1, January 1971, pp. 141-143.

SUMMARY OF THE INVENTION

The present invention provides a low electrical and low thermal impedance semiconductor component and a method for its manufacture. Initially, a semiconductor substrate with a first and a second surface, and a selected crystalline orientation and conductivity type is selected. On the first surface of the substrate a semiconductor device is fabricated. The second surface is controllably etched to form a cavity of limited lateral extent into the substrate adjacent to the selected location of the semiconductor device on the first surface. By selectively thinning the substrate region opposite the semiconductor device the substrate as a whole remains relatively rigid throughout the entire processing.

Prior to etching, the first surface of the substrate is chemically passivated to prevent etching of the first surface. This surface is also prepared to facilitate the selective masking of the second surface to allow etching of areas of limited lateral extent on the second surface opposite the location of the semiconductor device on the first surface. After both surfaces have been prepared, the cavity is controllably etched into the substrate to expose to the second surface of the substrate a selected surface area of the deepest layer of the semiconductor device on the first surface of the substrate.

The etching technique is a controlled technique such as a time-temperature controlled anisotropic etch or electrochemical anisotropic etch. Either of these anisotropic etching techniques will etch the substrate along its crystalline planes to form a cavity whose shape is defined by the selected crystalline axis orientation of the substrate. If the selected crystalline axis of the substrate has a (100) orientation or a (110) orientation, the resultant cavity will have a pyramidal or a rectangular shape respectively.

After the semiconductor device is fabricated on the first surface and the cavity is etched into the substrate from the second surface, both surfaces, including the surface of the cavity, are selectively metalized. The metalization on the first surface is to make electrical contact with selected layers of the semiconductor device from the first surface. The metalization of the second surface is a thick metallic layer filling the cavity. After the completed semiconductor component is separated from the remainder of the substrate, the thick metalization layer in the cavity becomes a thick metallic pedestal in electrical contact with the deepest layer of the semiconductor device. This thick metallic pedestal also provides a low thermal impedance heat sink to the semiconductor device.

The finished semiconductor component includes a semiconductor device having two surfaces. In addition, the semiconductor device is fabricated from a thin substrate and has a plurality of layers of selected conductivity types implementing the selected semiconductor device. The low electrical impedance of the finished component is a result of the thinness of the substrate of the semiconductor device.

The finished component further includes a metalization layer on each of two surfaces of the semiconductor device. One surface of the semiconductor device is metalized to make electrical contact with selected layers of the semiconductor device. The other surface of the semiconductor device is metalized to form a metallic pedestal that is substantially thicker than the device. This pedestal provides both electrical contact to the other surface of the device and a low thermal impedance heat sink for the device. This pedestal is also typically pyramidal or rectangular in shape.

DESCRIPTION OF THE PREFERRED EMBODIMENT

The immediately following description refers to the structure of a low electrical and low thermal impedance semiconductor component and a method of manufacturing that semiconductor component. The steps to be described of fabricating the semiconductor device on one surface of a substrate and of etching cavities into a second surface of the substrate can be performed in either order. It is also possible to intermix the many sub-steps of both of the above-mentioned steps to achieve the same result. However, to maximize the component yield from the substrate, it is desirable to maintain the structural strength of the selected substrate through as much of the process as possible. Therefore, the preferred order is to first fabricate the selected semiconductor devices on the first surface of the substrate and then to etch the cavities into the second surface of the substrate adjacent to the semiconductor devices.

The discussion that follows illustrates a particular implementation of a low resistance PIN diode by the preferred method.

Figure 1:
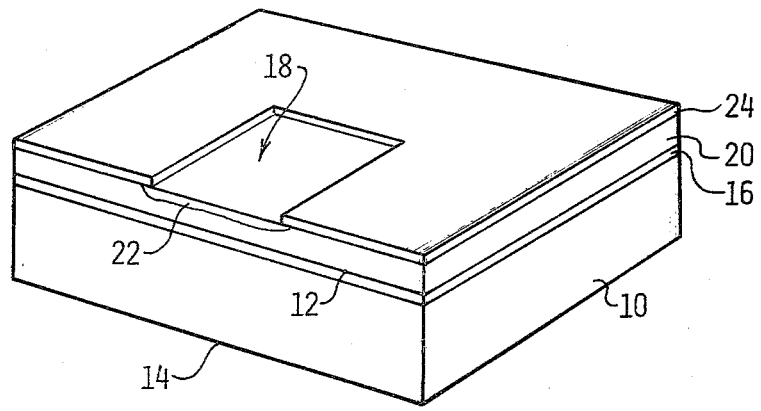
FIG. 1 is a cross-sectional view of the semiconductor substrate with a semiconductor device shown on one surface of the substrate.

FIG. 1 shows a semiconductor substrate 10 with a first surface 12 and a second surface 14. Substrate 10 will typically be selected to have a (100) or (110) crystalline orientation and be of a p− conductivity type Si with a thickness of between 220 and 330 microns. On first surface 12 a diode 18 is shown including a first diffusion layer 16 (typically an n+ conductivity layer), and an epitaxial layer 20 (typically an n− conductivity layer). A second diffusion layer 22 (typically a p+ conductivity layer), is diffused into epitaxial layer 20 through a window in a first protective layer 24 (typically SiO$_2$).

Figure 2:
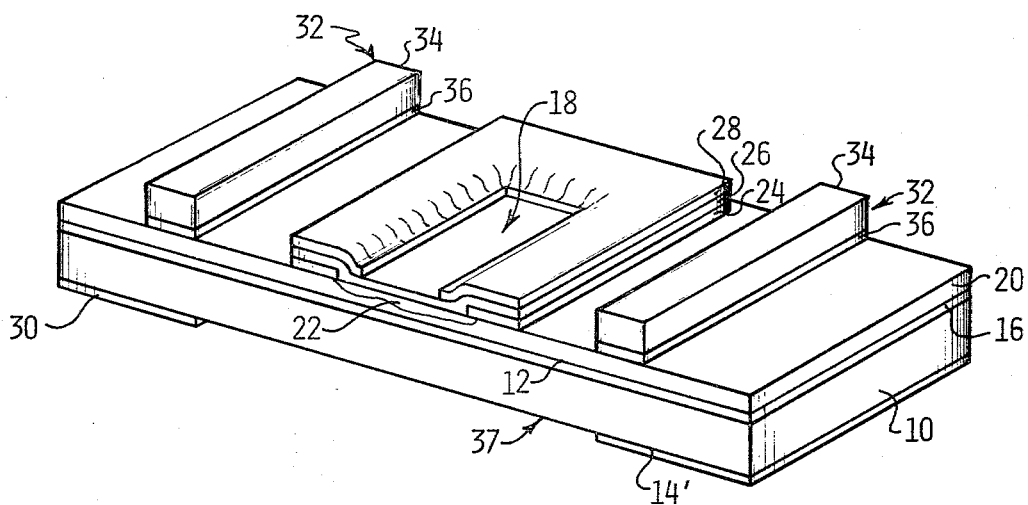
FIG. 2 is a cross-sectional view of the semiconductor substrate of FIG. 1 with the semiconductor device and substrate alignment means shown on one surface of the substrate.

FIG. 2 shows the same substrate shown in FIG. 1 after first surface 12 and second surface 14 have been prepared for the etching of second surface 14. First surface 12 is prepared by depositing one or more additional protective layers 26 and 28 on the entire surface of first protective layer 24 and the exposed second diffusion layer 22. These additional protective layers 26 and 28, and first protective layer 24, are then photomasked and removed from the field of substrate 10 leaving the multilayered protective structure in the vicinity of each of the individual devices on substrate 10. Generally, each layer is of a selected thickness with layer 26 being a nitride compound and layer 28 being SiO$_2$.

Second surface 14 is then lapped and polished to reduce the thickness of substrate 10 to approximately 115 microns, forming a new second surface 14′. A protective layer 30, typically a nitride compound, is then deposited on a new second surface 14′ of substrate 10.

The exposed layers on first surface 12 are then metalized. This metalization is then photomasked and selectively etched to form alignment registration bars 32. Generally, alignment bars 32 consist of a chromium layer 36 and a gold layer 34.

Protective layer 30 is next photomasked and etched to open a window 37 in alignment with alignment bars 32 and opposite each diode 18 on substrate 10. Alignment of the photomasking of protective layer 30 can be performed by any known method. An optical alignment technique utilizing infrared light is typically used.

Figure 3:
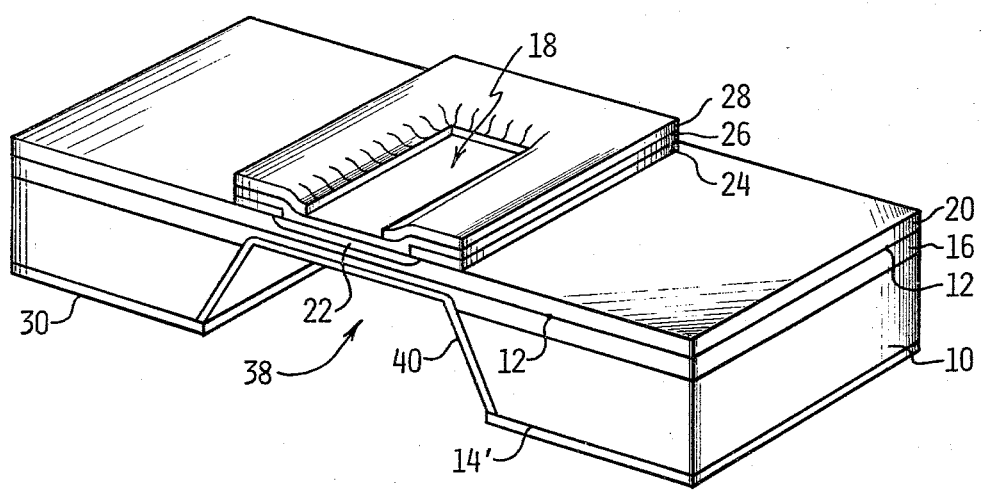
FIG. 3 is a cross-sectional view of the semiconductor substrate of FIG. 2 with a cavity of limited lateral extent etched into the other side of the substrate in alignment with the semiconductor device on the one surface.

Second surface 14′ of substrate 10 is etched by a controlled process through window 37 to form a cavity 38 opposite each diode 18 on substrate 10 as shown in FIG. 3. The etching of cavity 38 can be performed by a time-temperature controlled anisotropic technique, if the substrate and first diffusion layer 16 are of the same conductivity type, or an electrochemical anisotropic etching technique. However, the electrochemical anisotropic etching technique is preferred.

In electrochemical anisotropic etching of cavity 38, diffusion layer 16 and epitaxial layer 20 are biased above a critical voltage for the material of those layers. Second surface 14′ is then exposed to the etchant through the window 37. Substrate 10, being of a different conductivity type from layers 16 and 20, is thus biased below the critical voltage of the substrate material. This etching technique is characterized by a relatively sharp active/passive transition between those layers biased below and above the critical voltage, respectively. When etching is initiated, it proceeds rapidly along the crystalline axes of substrate 10 until first diffusion layer 16 is exposed to second surface 14′. When first diffusion layer 16 is reached by the etchant, the speed of the etching process drops by a factor of approximately 150 to 200. Etching is permitted to continue until a selected area of limited extent of first diffusion layer 16 is exposed to second surface 14′. Because of the selectable nature of the electrochemical anisotropic etching process, very little of first diffusion layer 16 is etched. The shape of cavity 38 is determined by the selected crystalline axis orientation of substrate 10 and the characteristic of the anisotropic etching process along that axis. A pyramidal cavity is obtained with a (100) crystalline orientation, as shown in FIG. 3, and a rectangular cavity (not shown) can be obtained with a (110) crystalline orientation when the substrate is etched anisotropically.

Next, alignment registration bars 32 are removed by a suitable technique. Then, phosphorus, or another suitable element, is diffused into the surface of cavity 38 forming a third diffusion layer 40. The purpose of third diffusion layer 40 is to getter the impurities from epitaxial layer 20 and to provide a high concentration of carriers at the surface of cavity 38.

Figure 4:
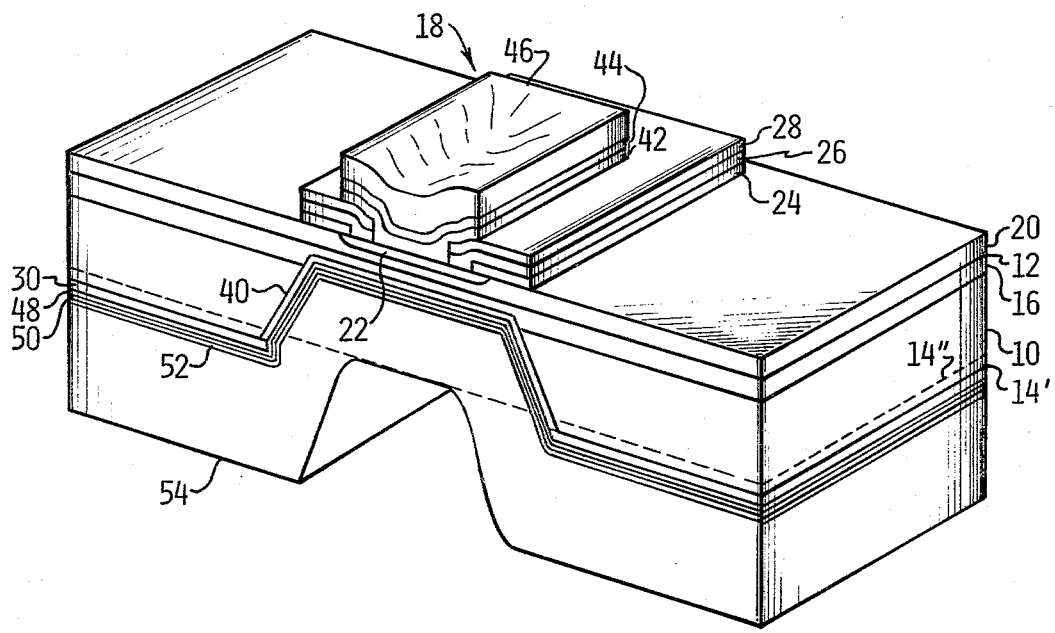
FIG. 4 is a cross-sectional view of the semiconductor substrate of FIG. 3 with both surfaces metalized.

FIG. 4 shows the addition of metalization layers to both surfaces 12 and 14' of substrate 10 in FIG. 3. Initially, protective layer 26 is etched through the window in protective layer 28 to exposed second diffusion layer 22. A multilayered metal button 42, 44 and 46 is then deposited on first surface 12 directly over diode 18 to make electrical contact with second diffusion layer 22. This metallic button typically consists of a titanium layer 42, a silver layer 44, and a thick gold layer 46. Second surface 14' is metalized with a multilayered metal coating over the entire surface and into cavity 38. The coating on second surface 14' typically consists of a titanium layer 48, a platinum layer 50, a silver layer 52, and an extremely thick silver layer 54. Silver layer 54 is approximately 125 microns thick.

Figure 5:
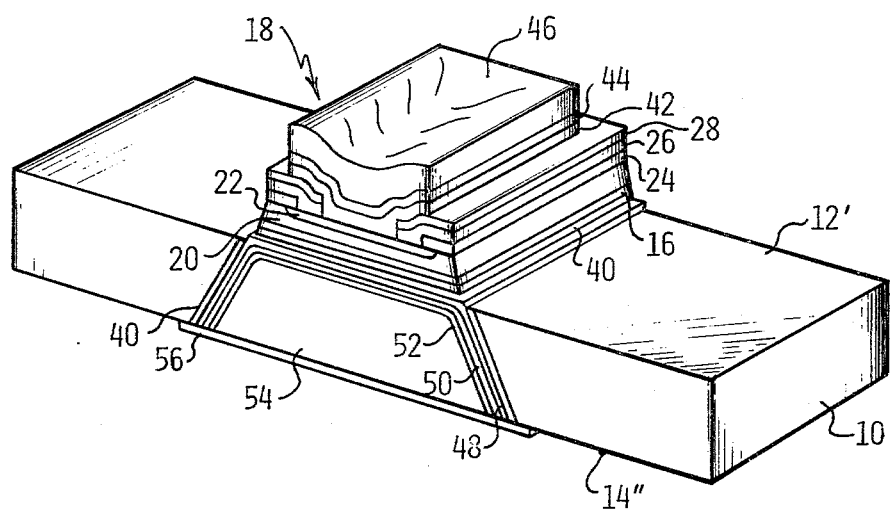
FIG. 5 is a cross-sectional view of the semiconductor substrate of FIG. 4 with the top surface etched separating the individual semiconductor from the substrate and the bottom surface lapped and polished to the desired thickness and remetalized.

FIG. 5 shows the results of the first step of separating diode 18 from the other devices on substrate 10. Silver layer 54 has been lapped and polished to the desired thickness, generally 115 microns forming second surface 14''. (See dashed line 14'' in FIG. 4.) Epitaxial layer 20 and first diffusion layer 16 have been etched, forming a new first surface 12' by removing those portions of layers 16 and 20 in the field of substrate 10 i.e., those portions of layers 16 and 20 not beneath protective layers 24, 26 and 28. Second surface 14'' is shown selectively metalized by a gold layer 56 to prevent silver layer 54 from oxidizing.

Figure 6:
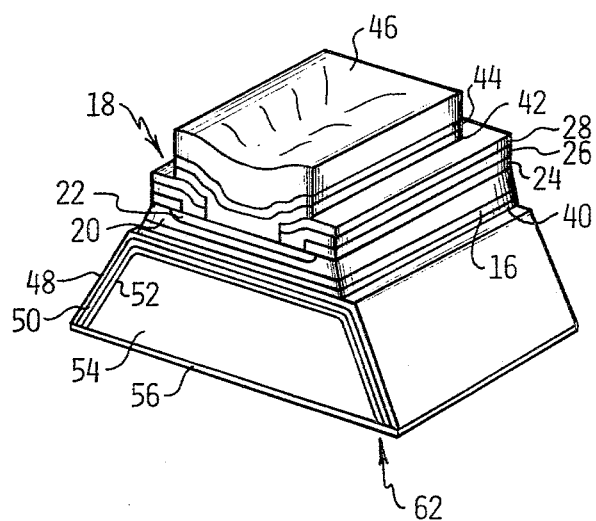
FIG. 6 is a cross-sectional view of the individual semiconductor device mounted on a metallic pyramidal pedestal.

FIG. 6 shows the complete diode after final separation has been completed by etching away the field of substrate 10 between the individual components. The resultant diode 18 is a thin semiconductor diode having low electrical resistance; second diffusion layer 22 and epitaxial layer 20 form the P-N junction. First diffusion layer 16 and third diffusion layer 40 form a gradual semiconductor/metallic transition to a metallic pyramidal pedestal 62. The thick metallic pedestal 62 provides both electrical contact to diode 18 and a low thermal impedance sink to draw heat from the diode junction and thus allows higher power operation of diode 18.

If the well-known scribe and break technique is utilized to separate the individual diodes on substrate 10, a multilayered eutectic metalization may be used in place of gold layer 56. The eutectic metalization is generally used for eutectic bonding of the semiconductor component, the PIN diode in this example, to the selected package or circuit for electrical interconnection. The eutectic metalization on second surface 14'' would typically consist of a first gold layer, a germanium layer, and a second gold layer.

The above-discussed process of producing diode 18 is by no means limited to the production of diodes. The process can easily be modified to produce any type semiconductor component where low electrical impedance and/or low thermal impedance is desired.

We claim:

1. A method of producing at least one low electrical and thermal impedance semiconductor component from a semiconductor substrate with a selected crystalline orientation whose bulk is a first conductivity type, said substrate having a first surface and a second surface, the method comprising the steps of:
  fabricating at least one semiconductor device on the first surface of the semiconductor substrate;
  controllably etching the second surface of the substrate to thin the cross-section of the selected location of each semiconductor device by forming a cavity of limited lateral extent adjacent to the selected location of each of the semiconductor devices on the first surface of the substrate, the etching continuing along the crystalline planes with the shape of the cavity being defined by the selected crystalline orientation of the substrate;
  selectively metalizing the first surface of the substrate after the fabricating step has been completed;
  metalizing the second surface, and the interior of the cavities therein, with a metallic layer that is at least as thick as those portions of the substrate surrounding each cavity to overfill each of the cavities; and
  lapping and polishing the second surface of the substrate to remove the metalization from, and to expose those areas of the substrate that surround each cavity and to thin the metalization within each cavity to a selected uniform thickness that is substantially thicker than the cross-section of the substrate in the location of the semiconductor devices.

2. A method of producing at least one low electrical and thermal impedance semiconductor component from a semiconductor substrate as in claim 1 wherein said method further comprises the step of separating the semiconductor devices on the substrate into individual semiconductor components following the lapping and polishing of the second surface of the substrate; the resultant semiconductor component having an accurately formed metallic pedestal that is substantially thicker than the semiconductor device mounted thereon to provide thermal heatsinking for the semiconductor device; and the shape of the pedestal being fully determined by the shape of the etched cavity and the lapping and polishing step.

3. A method of producing at least one low electrical and thermal impedance semiconductor component from a semiconductor substrate as in claim 2 wherein the step of separating the semiconductor devices one from the other includes the steps of:
  exposing to the first surface of the substrate a portion of the metalization in the deepest extent of the cavity within the second surface of the substrate that extends around the periphery of the semiconductor device on the first surface of the substrate; and
  removing the semiconductor devices from the unused substrate field surrounding the cavity metalization.

4. A method of producing at least one low electrical and thermal impedance semiconductor component from a semiconductor substrate with a selected crystalline orientation whose bulk is a first conductivity type, said substrate having a first surface and a second surface, the method comprising the steps of:
  fabricating at least one semiconductor device on the first surface of the semiconductor substrate;
  controllably etching the second surface of the substrate to thin the cross-section of the selected location for each semiconductor device by forming a cavity of limited lateral extent adjacent to the selected location of each of the semiconductor devices on the first surface of the substrate, the etching continuing along the crystalline planes with the shape of the cavity being defined by the selected crystalline orientation of the substrate;

selectively metalizing the first and second surface and the interior surfaces of the cavities within the second surface following the etching step, said second surface metallic layer being at least as thick as those portions of the substrate surrounding each cavity to overfill each of the cavities; and lapping and polishing the second surface of the substrate to remove the metalization from, and to expose those areas of the substrate that surround each cavity and to thin the metalization within each cavity to a selected uniform thickness that is substantially thicker than the cross-section of the substrate in the location of the semiconductor devices.

5. A method of producing at least one low electrical and thermal impedance semiconductor component from a semiconductor substrate as in claim 4 wherein said method further comprises the step of separating the semiconductor devices on the substrate into individual semiconductor components following the lapping and polishing of the second surface of the substrate; the resultant semiconductor component having an accurately formed metallic pedestal that is substantially thicker than the semiconductor device mounted thereon to provide thermal heatsinking for the semiconductor device; and the shape of the pedestal being fully determined by the shape of the etched cavity and the lapping and polishing step.

6. A method of producing at least one low electrical and thermal impedance semiconductor component from a semiconductor substrate as in claim 5 wherein the step of separating the semiconductor devices one from the other includes the steps of:

exposing to the first surface of the substrate a portion of the metalization in the deepest extent of the cavity within the second surface of the substrate that extends around the periphery of the semiconductor device on the first surface of the substrate; and removing the semiconductor devices from the unused substrate field surrounding the cavity metalization.

* * * * *